(12) United States Patent
Yakunin et al.

(10) Patent No.: US 8,755,032 B2
(45) Date of Patent: Jun. 17, 2014

(54) RADIATION SOURCE AND LITHOGRAPHIC APPARATUS

(75) Inventors: Andrei Mikhailovich Yakunin, Eindhoven (NL); Vadim Yevgenyevich Banine, Deurne (NL); Vladimir Vitalevich Ivanov, Moscow (RU); Erik Roelof Loopstra, Eindhoven (NL); Vladimir Mihailovitch Krivtsun, Moscow (RU); Gerardus Hubertus Petrus Maria Swinkels, Eindhoven (NL); Dzmitry Labetski, Utrecht (NL)

(73) Assignee: ASML Netherlands B.V., Veldhoven (NL)

( * ) Notice: Subject to any disclaimer, the term of this patent is extended or adjusted under 35 U.S.C. 154(b) by 495 days.

(21) Appl. No.: 13/063,139

(22) PCT Filed: Jul. 21, 2009

(86) PCT No.: PCT/EP2009/059337
§ 371 (c)(1),
(2), (4) Date: Mar. 9, 2011

(87) PCT Pub. No.: WO2010/028899
PCT Pub. Date: Mar. 18, 2010

(65) Prior Publication Data
US 2011/0164236 A1    Jul. 7, 2011

Related U.S. Application Data

(60) Provisional application No. 61/096,236, filed on Sep. 11, 2008, provisional application No. 61/136,790, filed on Oct. 3, 2008, provisional application No. 61/148,741, filed on Jan. 30, 2009.

(51) Int. Cl.
*G03B 27/54* (2006.01)
*G03B 27/52* (2006.01)
*G03B 27/42* (2006.01)

(52) U.S. Cl.
USPC ............................ 355/67; 355/30; 355/53

(58) Field of Classification Search
USPC ...................... 355/67, 30, 53; 250/492.2
See application file for complete search history.

(56) References Cited

U.S. PATENT DOCUMENTS 6,359,969 B1   3/2002   Shmaenok
6,933,510 B2   8/2005   Zukavishvili et al.
(Continued)

FOREIGN PATENT DOCUMENTS

CN    1498056 A    5/2004
CN    1762183 A    4/2006
(Continued)

OTHER PUBLICATIONS

Chinese Office Action dated Nov. 28, 2012 in corresponding Chinese Patent Application No. 200980134710.0.
(Continued)

*Primary Examiner* — Peter B Kim
(74) *Attorney, Agent, or Firm* — Pillsbury Winthrop Shaw Pittman LLP

(57) ABSTRACT

A radiation source is configured to generate extreme ultraviolet radiation. The radiation source includes a plasma formation site located at a position in which a fuel will be contacted by a beam of radiation to form a plasma, an outlet configured to allow gas to exit the radiation source, and a contamination trap at least partially located inside the outlet. The contamination trap is configured to trap debris particles that are generated with the formation of the plasma.

25 Claims, 7 Drawing Sheets

(56) References Cited

U.S. PATENT DOCUMENTS

| | | |
|---|---|---|
| 7,397,538 B2 | 7/2008 | Box et al. |
| 7,414,251 B2 | 8/2008 | Bakker |
| 7,460,646 B2 | 12/2008 | Zink |
| 7,696,492 B2 | 4/2010 | Wassink et al. |
| 8,071,963 B2 | 12/2011 | Van Herpen et al. |
| 2002/0084428 A1 | 7/2002 | Visser et al. |
| 2004/0141165 A1 | 7/2004 | Zukavishvili et al. |
| 2006/0203965 A1 | 9/2006 | Zink |
| 2007/0125968 A1 | 6/2007 | Klunder et al. |
| 2007/0170379 A1* | 7/2007 | Watson et al. ............. 250/515.1 |
| 2008/0142736 A1 | 6/2008 | Wassink et al. |

FOREIGN PATENT DOCUMENTS

| | | |
|---|---|---|
| JP | 2006-196890 | 7/2006 |
| JP | 2007-19031 | 1/2007 |
| JP | 2007-194590 | 8/2007 |
| JP | 2008-166772 | 7/2008 |
| WO | 2005096099 A2 | 10/2005 |
| WO | 2008072959 A2 | 6/2008 |

OTHER PUBLICATIONS

International Search Report for PCT International Patent Application No. PCT/EP2009/059337, mailed Oct. 26, 2009.

* cited by examiner

RADIATION SOURCE AND LITHOGRAPHIC APPARATUS

CROSS-REFERENCE TO RELATED APPLICATIONS

This application is the U.S. national phase entry of PCT/EP2009/059337, filed Jul. 21, 2009, which claims the benefit of priority from U.S. Provisional Application No. 61/096,236, filed Sep. 11, 2008, U.S. Provisional Application No. 61/136,790, filed Oct. 3, 2008, and U.S. Provisional Application No. 61/148,741, filed Jan. 30, 2009, the contents of all of which are incorporated herein by reference in their entireties.

FIELD

The present invention relates to a radiation source for generating extreme ultraviolet radiation and a lithographic apparatus.

BACKGROUND

A lithographic apparatus is a machine that applies a desired pattern onto a substrate, usually onto a target portion of the substrate. A lithographic apparatus can be used, for example, in the manufacture of integrated circuits (ICs). In that example, a patterning device, which is alternatively referred to as a mask or a reticle, may be used to generate a circuit pattern to be formed on an individual layer of the IC. This pattern can be transferred onto a target portion (e.g. including part of one or several dies) on a substrate (e.g. a silicon wafer). Transfer of the pattern is typically via imaging onto a layer of radiation-sensitive material (resist) provided on the substrate. In general, a single substrate will contain a network of adjacent target portions that are successively patterned. Known lithographic apparatus include steppers, in which each target portion is irradiated by exposing an entire pattern onto the target portion at one time, and scanners, in which each target portion is irradiated by scanning the pattern through a radiation beam in a given direction (the "scanning" direction) while synchronously scanning the substrate parallel or anti-parallel to this direction.

A theoretical estimate of the limits of pattern printing can be given by the Rayleigh criterion for resolution:

$$CD = k_1 * \frac{\lambda}{NA_{PS}} \quad (1)$$

where $\lambda$ is the wavelength of the radiation used, $NA_{PS}$ is the numerical aperture of the projection system used to print the pattern, $k_1$ is a process dependent adjustment factor, also called the Rayleigh constant, and CD is the feature size (or critical dimension) of the printed feature. It follows from the Rayleigh criterion that reduction of the minimum printable size of features can be obtained in three ways: by shortening the exposure wavelength $\lambda$, by increasing the numerical aperture $NA_{PS}$, or by decreasing the value of $k_1$.

In order to shorten the exposure wavelength, and thus reduce the critical dimension, it has been proposed to use an extreme ultraviolet (EUV) radiation source. EUV radiation sources are configured to output a radiation wavelength of about 13 nm. Thus, EUV radiation sources may constitute a significant step toward achieving small features printing. Possible sources of EUV radiation include, for example, laser-produced plasma sources, discharge plasma sources, or synchrotron radiation from electron storage rings. When using a plasma source, contamination particles are created as a by-product of the plasma generation. Generally, such contamination particles are undesired because they adhere for example to reflective surfaces of the lithographic apparatus. Build up of contamination particles on reflective surfaces of the lithographic apparatus reduces the reflectivity of those surfaces, and consequently may reduce the achievable throughput of the lithographic apparatus.

It is desirable to reduce the accumulation of contamination particles on reflective surfaces of the lithographic apparatus.

SUMMARY

According to a first aspect of the invention, there is provided a radiation source configured to generate extreme ultraviolet radiation, the radiation source comprising a plasma formation site at which a fuel will be contacted by a beam of radiation to form a plasma, an outlet configured to allow gas to exit the radiation source, and a contamination trap at least partially located inside the outlet.

The contamination trap may comprise a foil trap formed from a plurality of foils, the foils being constructed and arranged to trap debris particles arising from the generation of plasma at the plasma formation site.

At least some of the plurality of foils may be supported by the outlet, which may be via a support structure. In an embodiment, there may be a direct connection of the foils to the outlet.

The radiation source may further comprise a heater constructed and arranged to heat the contamination trap to a temperature sufficient to melt debris that is trapped by the contamination trap, or to a temperature sufficient to evaporate debris that is trapped by the contamination trap. The heater may be an induction heater.

At least part of each foil may have a line of sight to the plasma formation site.

Each foil may subtend an angle of less than 45 degrees with respect to a trajectory which extends radially from the plasma formation site.

At least part of each foil may point towards the plasma formation site, or towards a location which is in the vicinity of the plasma formation site.

According to a second aspect of the invention, there is provided a radiation source configured to generate extreme ultraviolet radiation, the radiation source comprising a plasma formation site at which a fuel will be contacted by a beam of radiation to form a plasma, an outlet configured to allow gas to exit the radiation source, and a contamination trap provided on a wall of the source, the contamination trap being configured to reduce the likelihood of debris particles scattering or splashing from the wall of the source onto a collector of the source.

The contamination trap may be provided outside an outer boundary of an EUV radiation cone formed by the collector.

The contamination trap may comprise a foil trap formed from a plurality of foils, the foils being constructed and arranged to trap debris particles arising from the generation of plasma at the plasma formation site.

The radiation source may further comprise a heater constructed and arranged to heat the contamination trap to a temperature sufficient to melt debris that is trapped by the contamination trap, or to a temperature sufficient to evaporate debris that is trapped by the contamination trap. The heater may be an induction heater.

At least part of each foil may have a line of sight to the plasma formation site.

Each foil may subtend an angle of less than 45 degrees with respect to a trajectory which extends radially from the plasma formation site.

At least part of each foil may point towards the plasma formation site, or towards a location which is in the vicinity of the plasma formation site According to a third aspect of the invention, there is provided a lithographic apparatus which includes the first or second aspects of the invention, or which includes both the first and second aspects of the invention.

According to an aspect of the invention, there is provided a radiation source is configured to generate extreme ultraviolet radiation. The radiation source includes a plasma formation site located at a position in which a fuel will be contacted by a beam of radiation to form a plasma, an outlet configured to allow gas to exit the radiation source, and a contamination trap at least partially located inside the outlet. The contamination trap is configured to trap debris particles that are generated with the formation of the plasma.

According to an aspect of the invention, there is provided a radiation source configured to generate extreme ultraviolet radiation. The radiation source includes a plasma formation site located at a position in which a fuel will be contacted by a beam of radiation to form a plasma, an outlet configured to allow gas to exit the radiation source, and a contamination trap provided on a wall of the source. The contamination trap is configured to reduce an amount of debris particles that scatter or splash from the wall of the source onto a collector of the source.

According to an aspect of the invention, there is provided a lithographic apparatus that includes a radiation source configured to generate extreme ultraviolet radiation. The radiation source includes a plasma formation site located at a position in which a fuel will be contacted by a beam of radiation to form a plasma, an outlet configured to allow gas to exit the radiation source, and a contamination trap at least partially located inside the outlet. The contamination trap is configured to trap debris particles that are generated with the formation of the plasma. A support is constructed and arranged to support a patterning device. The patterning device being configured to pattern the extreme ultraviolet radiation. A projection system constructed and arranged to project the patterned radiation onto a substrate.

According to an aspect of the invention, there is provided a lithographic apparatus that includes a radiation source configured to generate extreme ultraviolet radiation. The radiation source includes a plasma formation site located at a position in which a fuel will be contacted by a beam of radiation to form a plasma, an outlet configured to allow gas to exit the radiation source, and a contamination trap provided on a wall of the source. The contamination trap is configured to reduce an amount of debris particles that scatter or splash from the wall of the source onto a collector of the source. A support constructed and arranged to support a patterning device. The patterning device is configured to pattern the extreme ultraviolet radiation. A projection system constructed and arranged to project the patterned radiation onto a substrate.

BRIEF DESCRIPTION OF THE DRAWINGS

Embodiments of the present invention will now be described, by way of example only, with reference to the accompanying schematic drawings in which corresponding reference symbols indicate corresponding parts, and in which.

DETAILED DESCRIPTION

Figure 1:
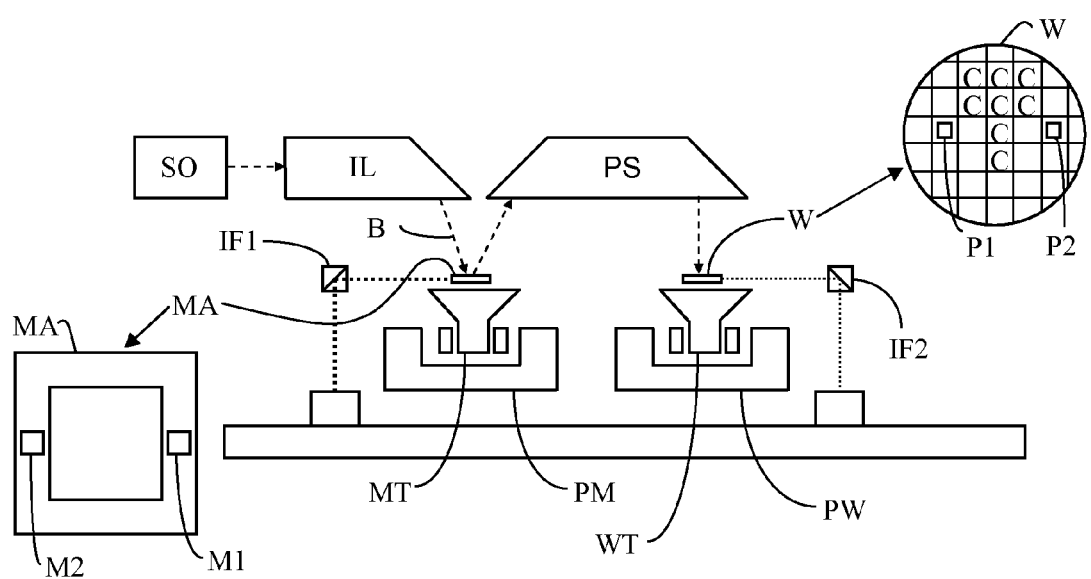
FIG. 1 schematically depicts a lithographic apparatus according to an embodiment of the invention.

FIG. 1 schematically depicts a lithographic apparatus according to an embodiment of the invention. The apparatus comprises: an illumination system (illumination system) IL configured to condition a radiation beam B of radiation. The apparatus also includes a support structure (e.g. a mask table) MT constructed to support a patterning device (e.g. a mask) MA and connected to a first positioner PM configured to accurately position the patterning device in accordance with certain parameters; a substrate table (e.g. a wafer table) WT constructed to hold a substrate (e.g. a resist-coated wafer) W and connected to a second positioner PW configured to accurately position the substrate in accordance with certain parameters; and a projection system (e.g. a refractive or reflective projection lens system) PS configured to project a pattern imparted to the radiation beam B by patterning device MA onto a target portion C (e.g. comprising one or more dies) of the substrate W.

The illumination system may include various types of optical components, such as refractive, reflective, magnetic, electromagnetic, electrostatic or other types of optical components, or any combination thereof, for directing, shaping, or controlling radiation.

The support structure MT holds the patterning device in a manner that depends on the orientation of the patterning device, the design of the lithographic apparatus, and other conditions, such as for example whether or not the patterning device is held in a vacuum environment. The support structure MT can use mechanical, vacuum, electrostatic or other clamping techniques to hold the patterning device. The support structure MT may be a frame or a table, for example, which may be fixed or movable as required. The support structure MT may ensure that the patterning device is at a desired position, for example with respect to the projection system. Any use of the terms "reticle" or "mask" herein may be considered synonymous with the more general term "patterning device."

The term "patterning device" used herein should be broadly interpreted as referring to any device that can be used to impart a radiation beam with a pattern in its cross-section such as to create a pattern in a target portion of the substrate. It should be noted that the pattern imparted to the radiation beam may not exactly correspond to the desired pattern in the target portion of the substrate, for example if the pattern includes phase-shifting features or so called assist features.

Generally, the pattern imparted to the radiation beam will correspond to a particular functional layer in a device being created in the target portion, such as an integrated circuit.

The patterning device may be reflective. Examples of patterning devices include masks, programmable mirror arrays, and programmable LCD panels. Masks are well known in lithography, and include mask types such as binary, alternating phase-shift, and attenuated phase-shift, as well as various hybrid mask types. An example of a programmable mirror array employs a matrix arrangement of small mirrors, each of which can be individually tilted so as to reflect an incoming radiation beam in different directions. The tilted mirrors impart a pattern in a radiation beam which is reflected by the mirror matrix.

The term "projection system" used herein should be broadly interpreted as encompassing any type of projection system, including refractive, reflective, catadioptric, magnetic, electromagnetic and electrostatic optical systems, or any combination thereof, as appropriate for the exposure radiation being used. Any use of the term "projection lens" herein may be considered as synonymous with the more general term "projection system".

As here depicted, the apparatus may be of a reflective type (e.g. employing a reflective mask).

The lithographic apparatus may be of a type having two (dual stage) or more substrate tables (and/or two or more patterning device tables). In such "multiple stage" machines the additional tables may be used in parallel, or preparatory steps may be carried out on one or more tables while one or more other tables are being used for exposure.

Referring to FIG. 1, the illumination system IL receives a radiation beam from a radiation source SO. The source SO and the illumination system IL, together with the beam delivery system if required, may be referred to as a radiation system.

The illumination system IL may comprise an adjuster for adjusting the angular intensity distribution of the radiation beam. Generally, at least the outer and/or inner radial extent (commonly referred to as σ-outer and σ-inner, respectively) of the intensity distribution in a pupil plane of the illumination system can be adjusted. In addition, the illumination system IL may comprise various other components, such as an integrator and a condenser. The illumination system may be used to condition the radiation beam, to have a desired uniformity and intensity distribution in its cross-section.

The radiation beam B is incident on the patterning device (e.g., mask) MA, which is held on the support structure (e.g., mask table) MT, and is patterned by the patterning device. Having traversed the patterning device MA, the radiation beam B passes through the projection system PS, which focuses the beam onto a target portion C of the substrate W. With the aid of the second positioner PW and position sensor IF2 (e.g. an interferometric device, linear encoder or capacitive sensor), the substrate table WT can be moved accurately, e.g. so as to position different target portions C in the path of the radiation beam B. Similarly, the first positioner PM and another position sensor IF1 can be used to accurately position the patterning device MA with respect to the path of the radiation beam B, e.g. after mechanical retrieval from a mask library, or during a scan. In general, movement of the support structure MT may be realized with the aid of a long-stroke module (coarse positioning) and a short-stroke module (fine positioning), which form part of the first positioner PM. Similarly, movement of the substrate table WT may be realized using a long-stroke module and a short-stroke module, which form part of the second positioner PW. In the case of a stepper (as opposed to a scanner) the support structure MT may be connected to a short-stroke actuator only, or may be fixed. Patterning device MA and substrate W may be aligned using patterning device alignment marks M1, M2 and substrate alignment marks P1, P2. Although the substrate alignment marks as illustrated occupy dedicated target portions, they may be located in spaces between target portions (these are known as scribe-lane alignment marks). Similarly, in situations in which more than one die is provided on the patterning device MA, the patterning device alignment marks may be located between the dies.

The depicted apparatus could be used in at least one of the following modes:

1. In step mode, the support structure MT and the substrate table WT are kept essentially stationary, while an entire pattern imparted to the radiation beam is projected onto a target portion C at one time (i.e. a single static exposure). The substrate table WT is then shifted in the X and/or Y direction so that a different target portion C can be exposed. In step mode, the maximum size of the exposure field limits the size of the target portion C imaged in a single static exposure.

2. In scan mode, the support structure MT and the substrate table WT are scanned synchronously while a pattern imparted to the radiation beam is projected onto a target portion C (i.e. a single dynamic exposure). The velocity and direction of the substrate table WT relative to the support structure MT may be determined by the (de-)magnification and image reversal characteristics of the projection system PS. In scan mode, the maximum size of the exposure field limits the width (in the non-scanning direction) of the target portion in a single dynamic exposure, whereas the length of the scanning motion determines the height (in the scanning direction) of the target portion.

3. In another mode, the support structure MT is kept essentially stationary holding a programmable patterning device, and the substrate table WT is moved or scanned while a pattern imparted to the radiation beam is projected onto a target portion C. In this mode, generally a pulsed radiation source is employed and the programmable patterning device is updated as required after each movement of the substrate table WT or in between successive radiation pulses during a scan. This mode of operation can be readily applied to maskless lithography that utilizes programmable patterning device, such as a programmable mirror array of a type as referred to above.

Combinations and/or variations on the above described modes of use or entirely different modes of use may also be employed.

Figure 2:
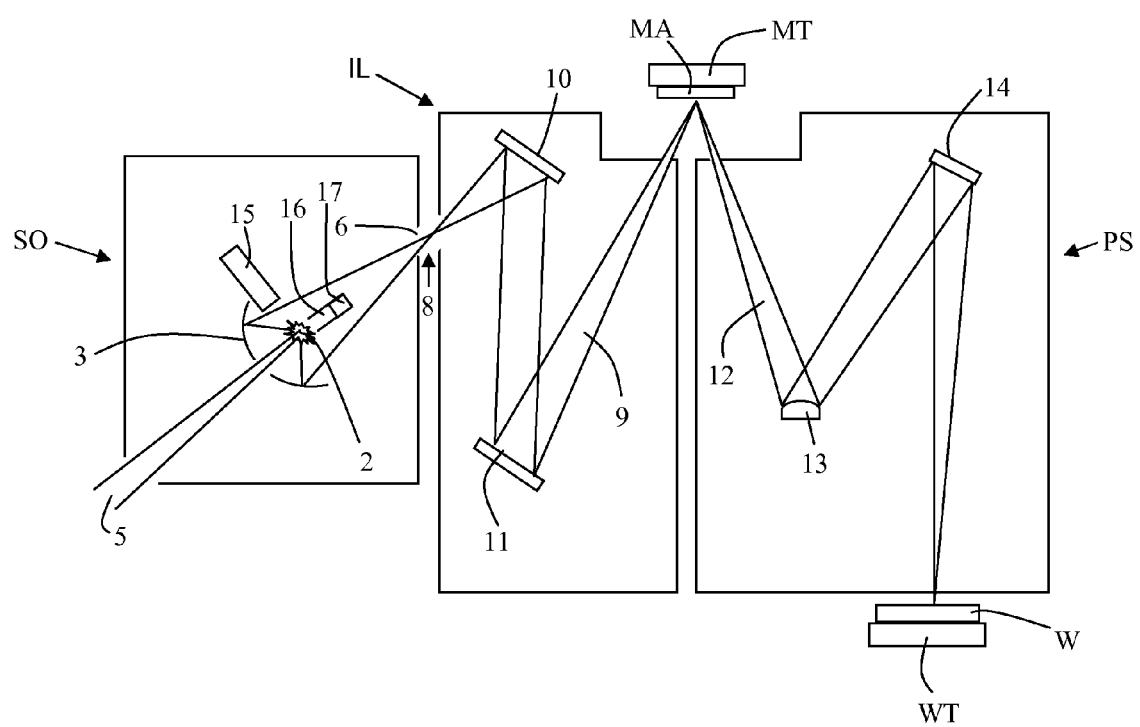
FIG. 2 schematically depicts in more detail the lithographic apparatus of FIG. 1.

FIG. 2 shows the apparatus of FIG. 1 in more detail, including the source SO, the illumination system IL, and the projection system PS. The source SO generates EUV radiation from a plasma which is formed at a plasma formation site 2. The plasma is created by directing a laser beam 5 onto droplets of a suitable material such as Sn or Gd which are generated by a droplet generator 15. The laser beam 5 causes the droplets to be vaporized, thereby generating the plasma. A source of this type may be referred to as a laser produced plasma (LPP) source.

Radiation emitted by the plasma at the plasma formation site 2 is collected by a collector 3, and is brought to an intermediate focus 8. The intermediate focus 8 acts as a virtual source point 8 at an aperture in the source SO. From the source SO, a beam of radiation 9 is reflected in the illumination system IL via first and second normal incidence reflectors 10, 11 onto the patterning device MA (e.g. a mask) positioned on support structure MT. A patterned beam 12 is formed which is imaged in the projection system PS via first and second reflective elements 13, 14 onto a substrate W held on a substrate table WT. More elements than shown may generally be present in the illumination system IL and projection system PS.

In an alternative configuration (not illustrated) the EUV radiation may be generated by causing a partially ionized plasma of an electrical discharge to collapse onto an optical axis (e.g. via the pinch effect). This source may be referred to as a discharge produced plasma (DPP) source. Partial pressures of for example 10 Pa of Xe, Li, Sn vapor or any other suitable gas or vapor may be used to generate the EUV radiation emitting plasma.

Although the collector 3 shown in FIG. 2 is a single curved mirror, the collector may take other forms. For example, the collector may be a Schwarzschild collector having two radiation collecting surfaces. In an embodiment, the collector may be a grazing incidence collector which comprises a plurality of substantially cylindrical reflectors nested within one another. The grazing incidence collector may be suited for use in a DPP source.

In general, a collector may be configured to collect radiation generated by a plasma, and to focus collected radiation to form a radiation beam. The radiation beam may pass through an aperture 6 between a source SO and an illumination system IL (shown schematically as separate apertures in the source SO and illumination system IL for ease of illustration). The aperture 6 may be a circular aperture, or have another shape (for example elliptical, square, etc.). The aperture 6 may be small, for example having a diameter less than about 10 cm, preferably less than 1 cm, (measured in a direction transverse to an optical axis of the lithographic apparatus).

When using a laser produced plasma (LPP) source or discharge produced plasma (DPP) source, contamination may be produced in the form of debris such as fast ions and/or neutral particles (for example Sn (tin)). Such debris may build up on the reflective surface(s) of the collector 3, causing the collector to lose reflectivity and thereby reducing the efficiency of the collector. Contamination by debris may also cause other reflective components of the lithographic apparatus (for example mirrors 10, 11, 13, 14 or patterning device MA) to lose reflectivity over time. The throughput of the lithographic apparatus is dependent upon the intensity of EUV radiation which is incident on a substrate being exposed. Any reduction of reflectivity which arises due to the build up of debris on the collector or other reflective surfaces of the lithographic apparatus may reduce the throughput of the lithographic apparatus.

In an embodiment of the invention, an outlet 16 is located adjacent to the plasma formation site 2. The outlet 16 is constructed to draw gas, and debris contained within the gas, out of the source SO. The gas may be provided from one or more inlets (not shown) which introduce gas into the source SO in order to allow a gas flow to be established from the inlets to the outlet 16. This gas flow may assist in drawing debris out of the source SO via the outlet 16, and thereby reduce contamination of the collector 3 and other reflective surfaces of the lithographic apparatus. The outlet 16 may for example comprise a pipe. The pipe may for example have a diameter of between 7 and 13 cm, for example a diameter of 10 cm.

The outlet 16 includes a 90 degree bend 17 (represented as a square in FIG. 2). After the bend 17, the outlet 16 extends out of the plane of FIG. 2, thereby carrying the outlet out of the source SO and allowing gas and debris to be removed from the source.

The outlet 16 also acts as a laser beam dump for the laser beam 5, the laser beam being incident upon a rear wall of the outlet 16.

Figure 3:
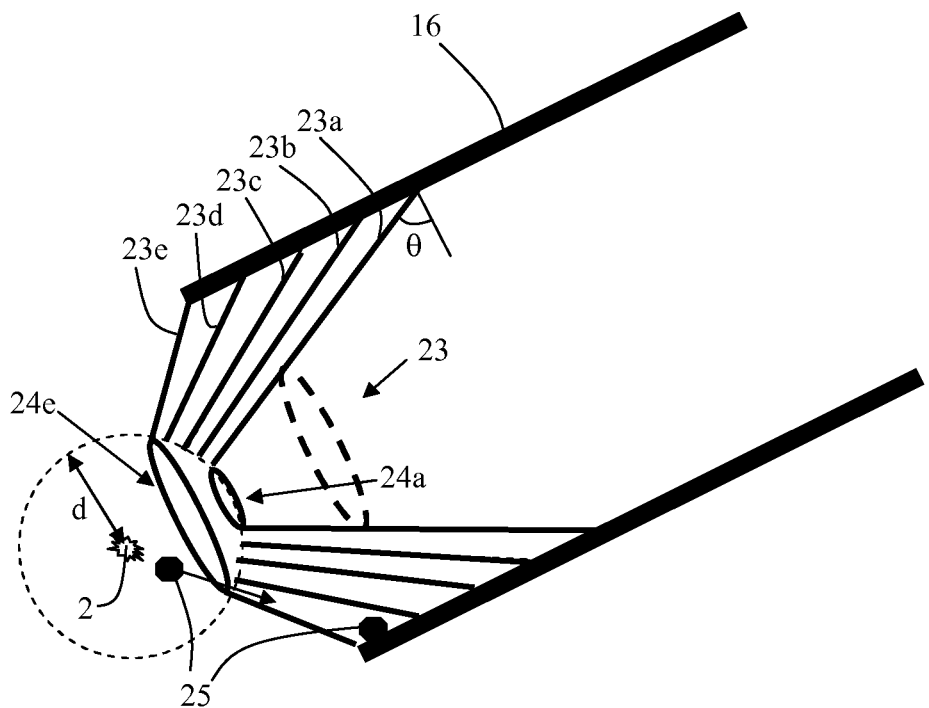
FIGS. 3 to 5 schematically depict an outlet of the lithographic apparatus provided with contamination traps according to embodiments of the invention.

Part of the outlet 16 is shown in more detail in FIG. 3. The outlet 16, which may comprise a pipe, has an opening which is adjacent to the plasma formation site 2 (for example less than 5 cm from the plasma formation site). A contamination trap, which is in the form of a foil trap 23, is located in the outlet 16. The foil trap 23 comprises a series of frustoconical foils 23*a-e* which are nested within one another. The frustoconical foils are circular in cross-section, as represented schematically by a dotted line indicated on the innermost foil 23*a*. The frustoconical foils 23*a-e* point towards the plasma formation site 2, or towards the vicinity of the plasma formation site.

Each frustoconical foil 23*a-e* is attached to an inner surface of the outlet 16, and is spaced apart from an adjacent frustoconical foil. The spacing between adjacent frustoconical foils may for example be less than 20 mm, less than 10 mm, or less than 5 mm. The angle θ which each frustoconical foil subtends relative to a normal from the surface of the outlet 16 is different for different frustoconical foils. An innermost frustoconical foil 23*a* subtends a greater angle θ than the adjacent frustoconical foil 23*b*, etc. (for ease of illustration only the first angle θ is indicated in FIG. 3). The outermost frustoconical foil 23*e* subtends the smallest angle. The angles subtended by the frustoconical foils 23*a-e* may be such that all of the frustoconical foils point towards the same location. This location may be in the vicinity of the plasma formation site 2. The location may be the plasma formation site 2.

The frustoconical foils 23*a-e* have openings which may differ in diameter. For ease of illustration, only the opening of the innermost frustoconical foil 24*a* and the opening of the outermost frustoconical foil 24*e* are specifically shown and labeled in FIG. 3. The innermost frustoconical foil 23*a* may have the smallest diameter opening 24*a*. The outermost frustoconical foil may have the largest diameter opening 24*e*. The openings of the frustoconical foils 23*a-e* may be dimensioned such that they are all equidistant from the plasma formation site 2 (or from a location in the vicinity of the plasma formation site). This is represented in FIG. 3 by a dotted circle which is a distance d from the plasma formation site 2. The openings of each of the frustoconical foils 23*a-e* lie on this circle. If FIG. 3 were to be in three dimensions, the dotted circle would be a sphere upon which the openings of each of the frustoconical foils 23*a-e* would lie.

In an alternative arrangement, the frustoconical foils 23*a-e* may all have openings of the same size.

Although five frustoconical foils 23*a-e* are shown in FIG. 3, any suitable number of frustoconical foils may be used.

Although the foils are shown and described as being frustoconical, the foils may have other suitable shapes. For example, the foils may have a near-conical shape. The foils may comprise a set of cylindrical foils which are nested within one another. The foils may include a portion which points towards the plasma formation site 2, or towards a location which is in the vicinity of the plasma formation site, and may further include a bend which connects to a different portion that does not point towards the plasma formation site 2, or towards a location which is in the vicinity of the plasma formation site. The bend may for example be halfway along the foils.

The contamination trap may comprise rings or flanges of different diameters having the same axis. It may comprise tapered blocks, which may be oriented so they point towards the plasma formation site 2, or towards a location which is in the vicinity of the plasma formation site. The tapered blocks may be randomly placed. The tapered blocks may be teeth-like structures.

In general, the contamination trap may be configured such that it presents surfaces which are not perpendicular to trajectories of debris particles emitted from the plasma formation site (i.e. radial lines drawn from the plasma formation site). The contamination trap may be configured such that it presents surfaces which subtend shallow angles with respect to trajectories of debris particles emitted from the plasma formation site (i.e. radial lines drawn from the plasma formation site). The shallow angle may for example be less than 45 degrees, less than 30 degrees, less than 20 degrees. The shallow angle may be between 0 and 20 degrees, and may be between 0 and 10 degrees.

Although the outlet is shown with a particular orientation (i.e. angled downwards), the outlet may have any suitable orientation. More than one outlet may be provided.

In use, a fuel droplet is generated by the droplet generator 15 (see FIG. 2) and travels to the plasma formation site 2. The laser beam 5 is incident upon the fuel droplet, thereby causing it to vaporize and form a plasma which emits EUV radiation. At the same time, debris may also be generated and ejected away from the plasma formation site 2. A debris particle 25 is shown schematically in FIG. 3 traveling away from the plasma formation site 2 and towards the foil trap 23 (into a space between the outermost foil 23e and the adjacent foil 23d). The debris particle 25 is also shown trapped between the outermost foil 23e and the adjacent foil 23d, resting against the inner surface of the outlet 16. Trapping of the debris particle 25 may comprise the debris particle being scattered (or splashed) from the inner surface of the outlet and then being incident on one of the foils 23d,e whereupon it adheres to the foil. Alternatively, trapping of the debris particle 25 may comprise the debris particle being incident on one of the foils 23d,e at a shallow incidence angle and thereby becoming attached to the foil.

Trapping the debris particle 25 prevents it from being incident upon the collector 3 (see FIG. 2) and reducing the reflectivity of the collector. If the foil trap 23 were not present, there would be a risk that the debris particle would be incident upon the inner surface of the outlet, scatter or splash back from it, and then travel to the collector. The foil trap 23 reduces the likelihood that a debris particle will be scattered or splashed back from the outlet 16 to the collector. In general, it may be said that the presence of a contamination trap (of which the foil trap 23 is an example) at the outlet may reduce the likelihood of debris being scattered or splashed back from the outlet 16 (which may be a pipe) to the collector.

The foil trap 23 (or other contamination trap) may perform one or more of the following functions: be transparent (or substantially transparent) for debris particles 25 arriving from the plasma formation site 2; create an obstruction for the debris particles 25 scattered or splashed from the walls of the outlet 16; accept debris particles from the plasma at grazing incidence (or shallow incidence angles) onto the foils. These functions may help debris particles to stick to the foils and not scatter or splash back to the collector.

A possible suppression factor of the number of debris particles (e.g. tin particles if the fuel droplets are formed from tin) which scatter or splash from the outlet 16 to the collector 3 may for example be greater than 10, greater than 50, or greater than 100. The suppression factor is the number of debris particles which would have been scattered or splashed back in the absence of the contamination trap, divided by the number of debris particles which are actually scattered or splashed back when the contamination trap is present.

For debris particles having a diameter of the order of 100 nm, the suppression factor is determined by the thickness t and length l of the foils, and the distance d between the foils. The thickness t is as measured at the opening 24a,e of a foil 23a-e, i.e. as seen by a debris particle traveling towards the foil (the foils may be sharpened at the opening). The transmission factor for particles arriving from the plasma is:

$$T \sim 1 - \frac{t}{d} \quad (2)$$

and the transmission factor for droplets returning back after scattering or splashing back from the outlet is:

$$S \sim \left(\frac{d}{l}\right)^2 \quad (3)$$

In an embodiment, for 100 nm diameter debris particles, foils 23a-e of the foil trap are separated by d=5 mm, have a thickness of t=0.1 mm and length of l=50 mm. The transmission factor S for debris particles traveling from the plasma towards to the foil trap is 0.98. The transmission factor T for scattered or splashed back debris particles traveling back through the foil trap is 0.01. The transmission factors can be combined to determine the suppression factor F:

$$F = \frac{1}{ST} \quad (4)$$

Figure 4:
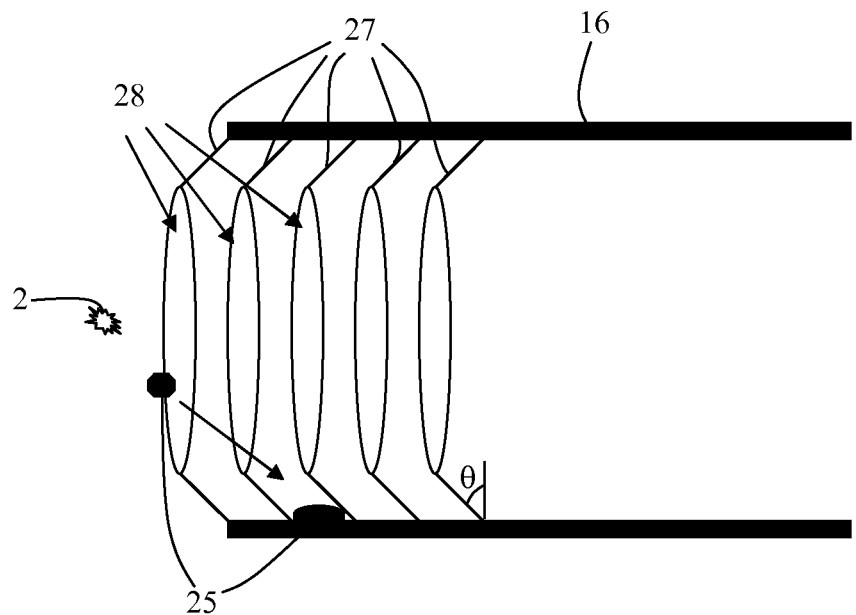

FIG. 4 illustrates an embodiment of the invention in which a contamination trap provided in the outlet 16 is a foil trap which comprises a series of foils 27 each having the same shape and dimensions. The foils 27 are frustoconical, but unlike the foils shown in FIG. 3 the openings 28 defined by the foils are all the same size. The foils 27, and hence the openings 28, are all different distances away from the plasma formation site 2. The foil trap acts in the same way as the foil trap shown in FIG. 3, receiving and trapping a debris particle 25 which is emitted from the plasma.

Figure 5:
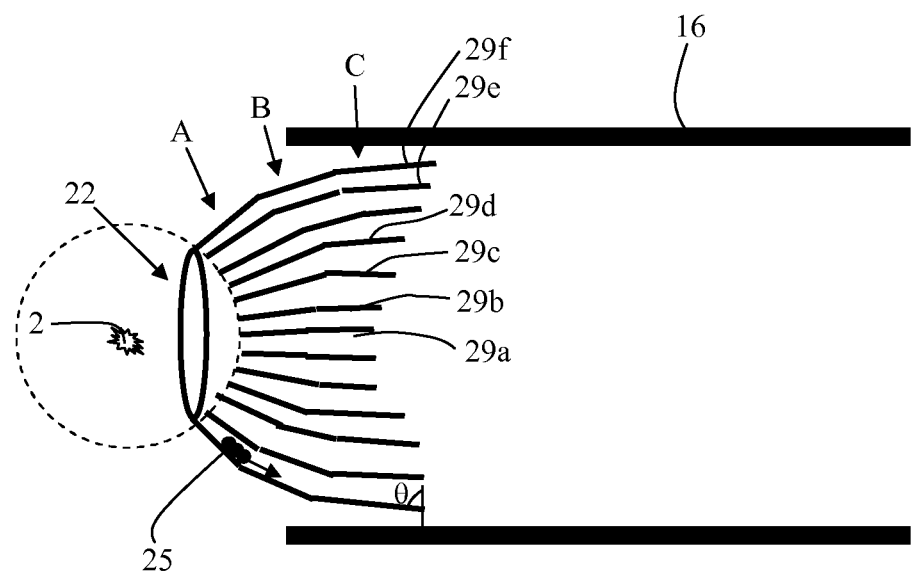

FIG. 5 illustrates an embodiment of the invention in which a contamination trap provided in the outlet 16 is a foil trap which comprises a series of foils 29a-f each having a compound form (a form which is formed from more than one frustocone). The foils are generally frustoconical, but have different portions which subtend different angles θ relative to a normal from the surface of the outlet 16. That portion of each foil 29a-f which is closest to the plasma formation site 2 (hereafter referred to as the first portion A) may point towards the same location. This location may be in the vicinity of the plasma formation site 2. The location may be the plasma formation site 2.

A portion of each foil which is further away from the plasma formation site 2 (hereafter referred to as the second portion B) may subtend a different angle θ relative to the normal. The angle θ which is subtended by the second portion B may be greater than the angle subtended by the first portion A. A portion of each foil which is still further away from the plasma formation site 2 (hereafter referred to as the third portion C) may subtend a different angle θ relative to the normal. The angle θ which is subtended by the third portion C may be greater than the angle subtended by the second portion.

The foils 29a-f are supported by a support structure (not illustrated) which is fixed to the outlet 16.

The frustoconical foils 29a-f have openings which may differ in diameter. For ease of illustration, only the opening 22 of the outermost frustoconical foil 29f is specifically shown and labeled in FIG. 5. The outermost frustoconical foil 29f may have the largest diameter opening 22. The innermost frustoconical foil 29a may have the smallest diameter opening. The openings of the frustoconical foils 29a-f may be dimensioned such that they are all equidistant from the plasma formation site 2 (or from a location in the vicinity of the plasma formation site).

The compound shapes of the foils 29a-f shown in FIG. 5 are chosen to reduce the likelihood that a debris particle 25 which is incident on the foils is scattered or splashed back towards the collector. Taking as an example the outer foil 29f, a first portion A of this foil points towards the plasma formation site 2 or a location in the vicinity of the plasma formation site. This has the result that a debris particle 25 is unlikely to be scattered or splashed back towards the collector, but is instead likely to be received between this foil 29f and an adjacent foil 29e. Once the debris particle 25 has been received, it may scatter or splash along the foil 29f and thereby enter the second B or third C portion of the foil. The different angles subtended by the second B and third C portions of the foil have the effect of making the path to the collector more difficult to travel, thereby reducing the likelihood of the debris particle 25 being scattered or splashed back towards the collector from the second and third portions.

Although three different foil portions A-C which subtend different angles θ relative to the normal from the outlet 16 are labeled in FIG. 5, it is not necessarily the case that all foils have three different portions which subtend different angles. One or more of the foils may for example have two portions which subtend different angles. In general, any number of foils may comprise any number of portions. One or more of the foils may include a portion which subtends an angle of more than 90 degrees with respect to the normal from the surface of the outlet 16.

One or more features of the foil traps of FIGS. 3 to 5 may be combined with each other. These include the foils having openings which are different distances from the plasma formation site; the foils having openings which are the same distance from the plasma formation site; the foils subtending the same angle with respect to a normal from the surface of the outlet 16; the foils subtending different angles with respect to a normal from the outlet 16; the foils having openings of different sizes; the foils having openings of the same size; the foils all pointing towards the plasma formation site or to the vicinity of the plasma formation site. Any suitable number of foils may be provided (e.g. more than 3 foils, more than 5 foils, more than 7 foils, etc.).

Structures which are the same as or similar to those described above may be provided at locations in the source SO other than in an outlet (or in addition to in an outlet). For example, the structures may be provided on parts of the source SO which are directly exposed to the plasma (i.e. which have a line of sight to the plasma formation site 2). In an embodiment, a contamination trap may be provided on a wall of the source SO.

Figure 6:
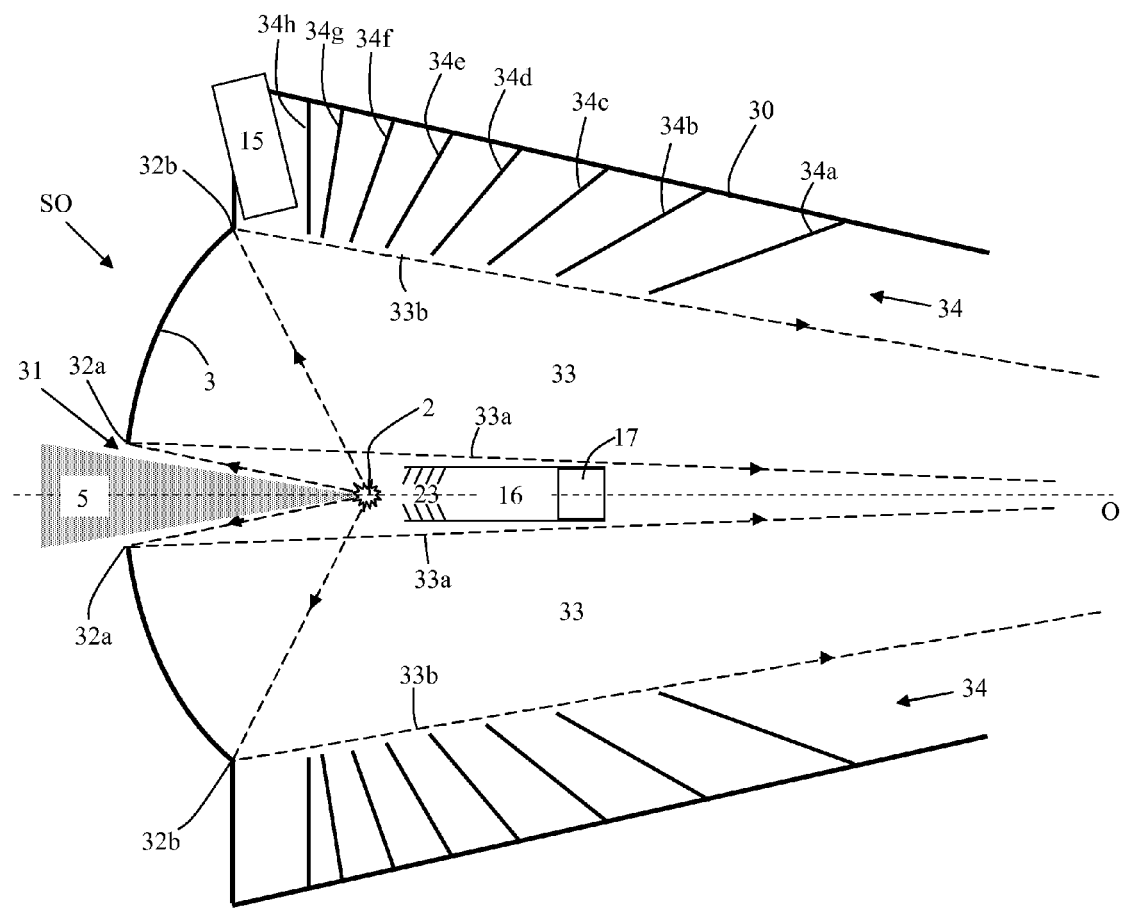
FIG. 6 schematically depicts a source of the lithographic apparatus provided with a contamination trap according to an embodiment of the invention.

FIG. 6 shows the source SO of FIG. 2 in more detail. For ease of illustration, in FIG. 6 the source SO is oriented horizontally rather than at an angle. However, the source SO may be oriented at any angle. Walls 30 of the source SO are shown, rather than merely showing a schematic box (as was done in FIG. 2).

As shown in FIG. 6, the collector 3 includes an opening 31 through which the laser beam 5 passes. The laser beam is focused onto the plasma formation site 2, where it is incident upon a fuel droplet generated by the droplet generator 15 and thereby generates a plasma which emits EUV radiation.

The plasma emits the EUV radiation over a range of directions. However, due to the collector 3 having a finite radius and having an opening 31, not all of the EUV radiation is collected by the collector. An example of a suitable collector 3 radius is 320 mm, although collectors having other radii may be used. An inner edge 32a and an outer edge 32b of the collector 3 together define a cone of EUV radiation 33 which is directed from the collector to an intermediate focus (the intermediate focus is beyond the edge of FIG. 6 but is shown in FIG. 2). The EUV radiation cone 33 has an inner boundary which is represented by dotted lines 33a and an outer boundary which is represented by dotted lines 33b.

Figure 7:
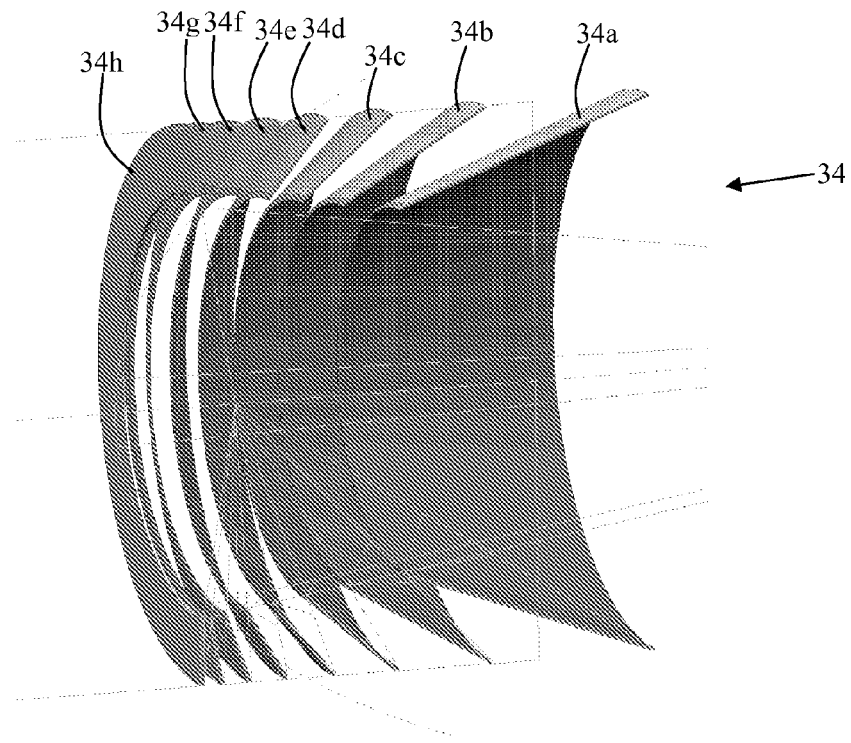
FIGS. 7 and 8 show the contamination trap of FIG. 6 in more detail.

One or more contamination traps 23, 34 may be provided in locations which are outside of the EUV radiation cone 33 formed by the collector 3. For example, the outlet 16 and associated contamination trap 23 (which may comprise foils) may be provided within the inner boundary 33a of the EUV radiation cone 33. A contamination trap 34 may be provided outside of the outer boundary 33b of the EUV radiation cone 33. A cut-away perspective view of the contamination trap 34 is illustrated in FIG. 7.

As mentioned above, the outlet 16 may be a pipe, which may include a portion 17 that extends out of the plane of FIG. 6. This portion 17 of the pipe may traverse the EUV radiation cone 33 and thereby obscure some EUV radiation. The pipe may be arranged such that some or all of the obscured EUV radiation would have been obscured by some other component (not illustrated) of the source SO. Since the contamination trap is provided within the outlet 16 (e.g. the pipe), or the majority of the contamination trap is provided within the outlet (or pipe), it may be the case that little or no EUV radiation is obscured by the contamination trap itself (e.g. the foil trap 23).

The contamination trap 34 provided outside of the outer boundary 33b of the EUV radiation cone 33 may comprise a plurality of foils 34a-h which extend from the wall 30 of the source SO. The foils 34a-h may be frustoconical, and are represented in perspective in three dimensions in FIG. 6. The foils 34a-h may be arranged such that they do not extend into the EUV radiation cone 33, thereby avoiding that the foils reduce the amount of EUV radiation which is available for use by the lithographic apparatus. The foils 34 reduce the likelihood of debris particles scattering or splashing back from the wall 30 of the source and being incident upon the collector 3.

The foils 34a-h may include any of the features or configurations described above in relation to FIGS. 3 and 4. The contamination trap 34 may comprise tapering blocks, or some other suitable structure. The spacing between adjacent foils 34a-h may for example be less than 40 mm, less than 20 mm, less than 10 mm, or less than 5 mm. The spacing of adjacent foils 34a-h provided on the wall 30 of the source SO may be different to the spacing of adjacent foils provided inside the outlet 16. It may be the case that the spacing of adjacent foils 34a-h provided on the wall of the source is smaller than the spacing of adjacent foils provided inside the outlet 16.

The droplet generator 15 is shown in FIG. 6 at an angle of approximately 70 degrees relative to the optical axis O of the source SO. However, the droplet generator 15 may be provided at any suitable angle. For example, the droplet generator 15 may be oriented perpendicular to the optical axis O. Where this is the case, one or more of the foils 34a-h may be removed in order to accommodate the droplet generator (which would be moved to the right in FIG. 6). Alternatively, a gap may be provided in one or more of the foils 34a-h. In general, it may be possible to provide a gap in one or more foils (i.e. such that the foil does not extend around a full circumference) in order to accommodate a component of the source SO. In such circumstances, the foil which is provided with the gap may still be described as being frustoconical.

Figure 8:
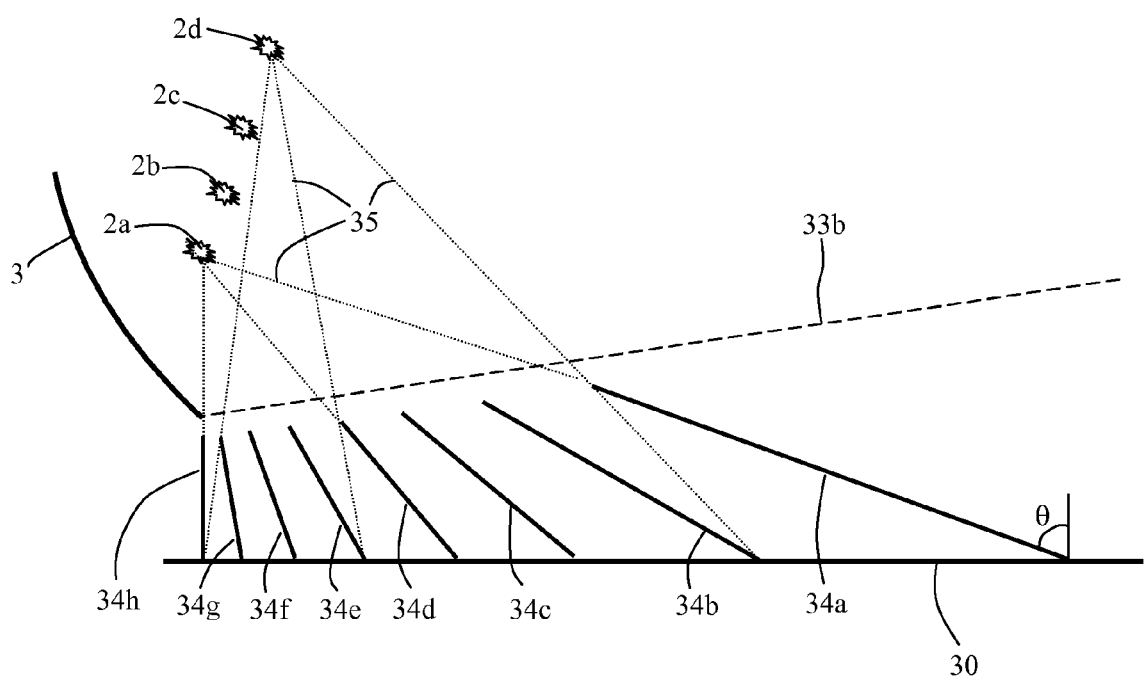

FIG. 8 is a side view of the contamination trap 34 of FIGS. 4 and 5. In FIG. 8 the angle θ of one of the foils 34a relative to a normal from the wall 30 of the source is labeled (for clarity of illustration the angles of the other foils are not labeled). As illustrated, the angle of each of the foils 34a-h is different, such that each foil points at the same location 2a. The plasma formation site 2a may be provided at this location. Where this is the case, debris particles emitted from the plasma will be incident at a glancing angle on the foils 34a-h. The plasma formation site may be at any suitable location. For example, the plasma formation site may be provided at any of the four locations 2a-d shown in FIG. 8 (or at any location in between).

The angle at which debris particles are incident upon a foil will depend upon the location of the plasma formation site 2a-d with respect to the foils 34a-h. FIG. 8 illustrates this by showing some possible debris particle trajectories as dotted lines 35. In all cases, there is a line of sight from a side of each foil 34a-h to the plasma formation site 2a-d, and debris particles emitted from the plasma will be incident on a given foil 34a-h with a shallow angle. The shallow angle may for example be less than 45 degrees, may for example be less than 30 degrees, and may for example be less than 20 degrees. The shallow angle may be between 0 and 20 degrees, and may be between 0 and 10 degrees.

When the plasma formation site is at location 2a, the foils 34a-h may be described as pointing towards the plasma formation site 2a. When the plasma formation site is at one of the other locations 2b-d (or some location in between 2a and 2d), then the foils may be described as pointing towards the vicinity of the plasma formation site.

A contamination trap which corresponds to that shown in FIGS. 6 to 8 may be provided at some location other than on the walls of the source SO.

Figure 9:
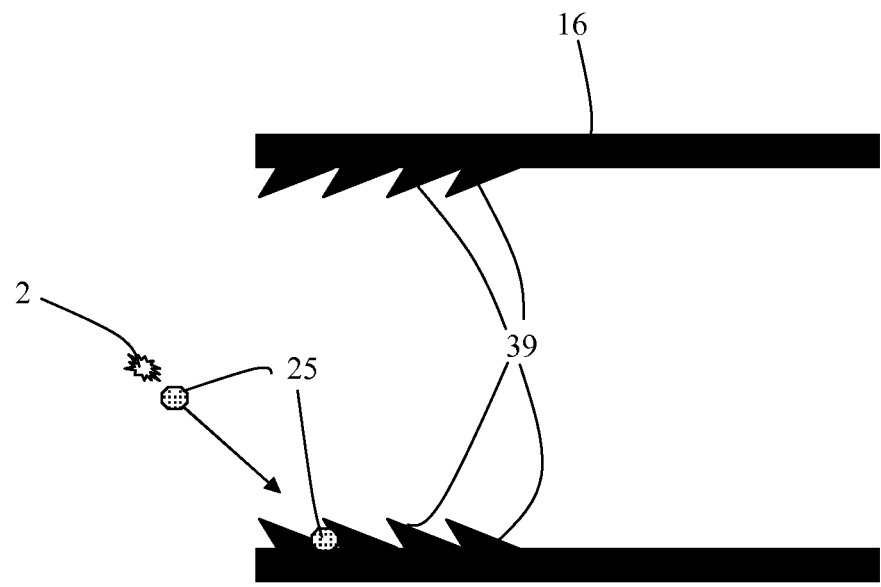
FIG. 9 shows a contamination trap according to an embodiment of the invention.

FIG. 9 illustrates an embodiment of the invention in which the contamination trap comprises tapering blocks 39. The tapering blocks 39 may extend from an inner surface of the outlet 16 (which may be a pipe), or may extend from an inner surface of a wall of the source, or from any other suitable location. The tapering blocks 39 may be regularly positioned or irregularly positioned (e.g. randomly positioned). The tapering blocks 39 may be configured to point towards the plasma formation site 2, or to a location in the vicinity of the plasma formation site. The tapering blocks may for example comprise teeth-like structures. The tapering of the blocks may be oriented towards the plasma formation site 2, or to a location in the vicinity of the plasma formation site.

The contamination trap (e.g. the any of the contamination traps described above) may be heated. Heating of the contamination trap may reduce the likelihood of debris particles scattering or splashing in uncontrolled directions when it they are incident on the contamination trap.

The contamination trap may be heated to a temperature which is sufficiently high that at least some (possibly substantially all) of the debris particles trapped by the contamination trap evaporate. The evaporated contamination may then be removed from the trap, for example by the gas flow which passes through the outlet 16. For example, the debris particles may comprise tin particles, which may be captured by the trap and then evaporated and removed from the trap by the gas flow.

The contamination trap may be heated to a temperature which is sufficiently high that at least some (possibly substantially all) of the debris particles trapped by the contamination trap are melted. The temperature may be sufficiently low that the majority of the contamination does not evaporate. The melted contamination (e.g. tin) may be collected and removed from the source. Melting and removing the contamination has an advantage over evaporating and removing the contamination, in that subsequent condensation of evaporated contamination on surfaces of the source is avoided. In addition, absorption of EUV radiation by evaporated contamination is avoided.

Figure 10:
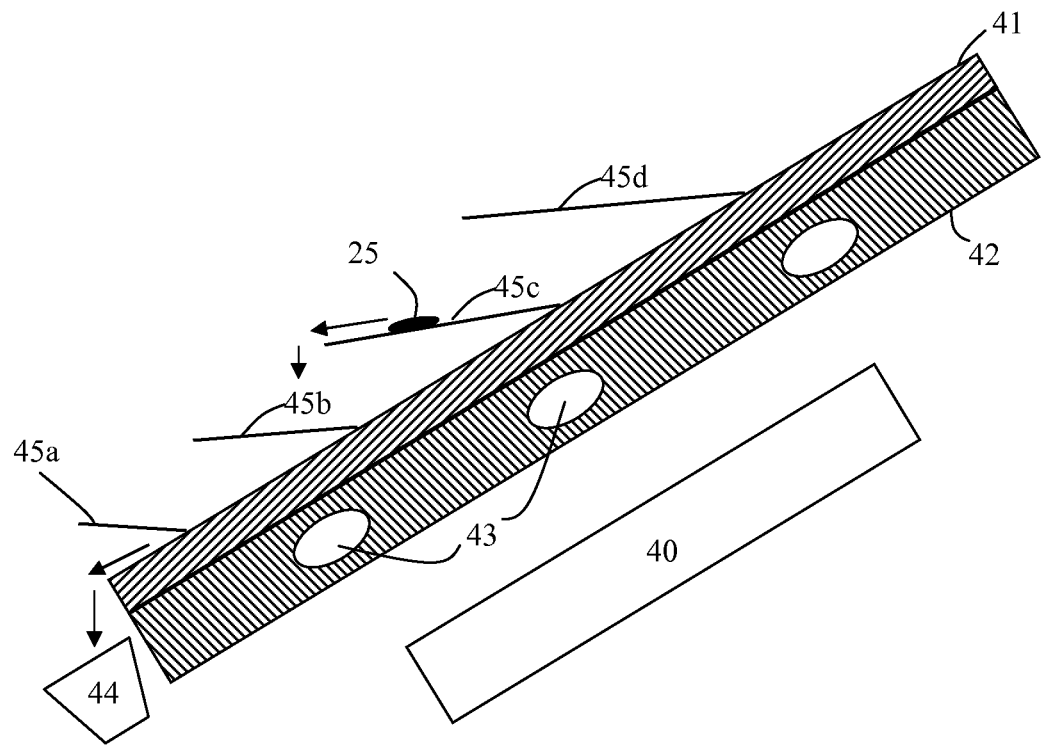
FIG. 10 schematically depicts a contamination trap and an associated heater according to an embodiment of the invention.

As shown in FIG. 10, the external heat source may be an induction heater 40. The induction heater 40 includes a coil (not shown) and is constructed and arranged to induce eddy currents within the foils 45a-d, and thereby heat the foils. The foils 45a-d may be made from material which is a good conductor of heat, such that heat which arises in the foils due to eddy currents is distributed across each foil by conduction. Other forms of heater (e.g. a heater based on electrical resistivity) may be used.

The foils may be provided for example on a wall 41 of a pipe, which may be oriented at an angle. To prevent leakage of the heat that is generated by the induction heater 40, a shield in the form of a wall 42 of thermally insulating material may be provided outside of the pipe 41. The wall 42 of thermally insulating material may be provided with one or more cooling tubes 43 through which a suitable cooling fluid, such as water, may flow. In the illustrated embodiment, the cooling tube 43 is provided within the wall 42 of thermally insulating material, although the cooling tube may alternatively be located on an inner or outer surface of the wall 42 of thermally insulating material. To prevent heating of the wall 42 of thermally insulating material, especially when the inductive heater 40 is positioned outside of the wall 42 of thermally insulating material, the wall 42 of thermally insulating material may be made from electrically non-conducting materials, such as aluminum oxide or silicon oxide. The cooling tubes 43 inside the wall 42 of thermally insulating material should not be heated and therefore may also be made from electrically non-conducting material.

The induction heater 40 may be configured to heat the foils 45a-d above the melting temperature of the debris particles (e.g. tin) so that the debris remains in liquid form, which will allow the liquid debris to flow over the foils.

At least some of the foils 45a-d may be arranged such that liquid debris may flow along a foil and then drop from that foil onto an adjacent foil (for example due to gravity). For example, a debris particle 25 lands on a foil 45c, where it melts. The liquid debris 25 flows along the foil 45c and drops off that foil onto an adjacent foil 45b. The liquid debris 25 then flows along that foil 45b and drops onto an adjacent foil 45a. This foil is angled such that the liquid debris flows towards the base of the foil 45a. A channel (or other opening—not shown) is provided at the base of this foil 45a such that the liquid debris 25 may flow through this channel. The liquid debris 25 may then flow along the wall 41 of the pipe and drop into a receptacle 44. A drain (not shown) may drain the liquid debris from the receptacle 44 out of the source SO.

In alternative arrangements to that shown in FIG. 10, a plurality of the foils (possibly all of the foils) may all be oriented such that the liquid debris flows towards the base of the foil. The foils may be provided with channels or other openings, which allow the liquid debris to pass beneath the foils and flow into a collector.

In general, the orientation of the foils may be selected so as to provide a desired direction of flow of liquid debris.

The heated foils may be provided for example on an inner surface of an outlet (e.g. a pipe), on a wall of the source, or any other suitable location.

Any foil, tapered block, or other contamination trap maybe heated by a heater. The heater may be an induction heater or some other form of heater.

The above description of embodiments of the invention refers to reflective surfaces of the lithographic apparatus. These may be considered to be examples of optical surfaces of the lithographic apparatus. It is not necessarily the case that all optical surfaces of the lithographic apparatus are reflective.

The term extreme ultraviolet (EUV) radiation as used above may be interpreted as meaning electromagnetic radiation having a wavelength of less than 20 nm, for example within the range of 10-20 nm, for example within the range of 13-14, for example within the range of 5-10 nm, for example such as 6.7 nm or 6.8 nm.

Although specific reference may be made in this text to the use of lithographic apparatus in the manufacture of ICs, it should be understood that the lithographic apparatus described herein may have other applications, such as the manufacture of integrated optical systems, guidance and detection patterns for magnetic domain memories, flat-panel displays, liquid-crystal displays (LCDs), thin-film magnetic heads, etc. It should be appreciated that, in the context of such alternative applications, any use of the terms "wafer" or "die" herein may be considered as synonymous with the more general terms "substrate" or "target portion", respectively. The substrate referred to herein may be processed, before or after exposure, in for example a track (a tool that typically applies a layer of resist to a substrate and develops the exposed resist), a metrology tool and/or an inspection tool. Where applicable, the disclosure herein may be applied to such and other substrate processing tools. Further, the substrate may be processed more than once, for example in order to create a multi-layer IC, so that the term substrate used herein may also refer to a substrate that already contains multiple processed layers.

The descriptions above are intended to be illustrative, not limiting. Thus, it will be apparent to one skilled in the art that modifications may be made to the invention as described without departing from the scope of the claims set out below.

The invention is not limited to application of the lithographic apparatus or use in the lithographic apparatus as described in the embodiments. Further, the drawings usually only include the elements and features that are necessary to understand the invention. Beyond that, the drawings of the lithographic apparatus are schematic and not on scale. The invention is not limited to those elements, shown in the schematic drawings (e.g. the number of mirrors drawn in the schematic drawings).

The person skilled in the art will understand that embodiments described above may be combined.

What is claimed is:

1. A radiation source configured to generate extreme ultraviolet radiation, the radiation source comprising:
   a plasma formation site located at a position in which a fuel will be contacted by a beam of radiation to form a plasma;
   an outlet configured to allow gas to exit the radiation source and to act as a beam dump for the beam of radiation; and
   a contamination trap at least partially located inside the outlet, the contamination trap being configured to trap debris particles that are generated with the formation of the plasma.

2. The radiation source according to claim 1, wherein the contamination trap comprises a foil trap formed from a plurality of foils, the foils being constructed and arranged to trap the debris particles.

3. The radiation source according to claim 2, wherein at least some of the plurality of foils are supported by the outlet.

4. The radiation source according to claim 2, wherein at least part of each foil has a line of sight to the plasma formation site.

5. The radiation source according to claim 4, wherein each foil subtends an angle of less than 45 degrees with respect to a trajectory which extends radially from the plasma formation site.

6. The radiation source according to claim 2, wherein at least part of each foil points towards the plasma formation site, or towards a location which is in the vicinity of the plasma formation site.

7. The radiation source according to claim 2, wherein the foils have compound shapes.

8. The radiation source according to claim 1, wherein the outlet comprises a pipe.

9. The radiation source according to claim 1, wherein the contamination trap comprises a plurality of tapering blocks, the tapering blocks being constructed and arranged to trap the debris particles.

10. The radiation source according to claim 1, further comprising a heater constructed and arranged to heat the contamination trap to a temperature sufficient to melt debris that is trapped by the contamination trap, or to a temperature sufficient to evaporate debris that is trapped by the contamination trap.

11. The radiation source according to claim 10, where in the heater is an induction heater.

12. The radiation source according to claim 11, wherein the contamination trap comprises a foil trap formed from a plurality of foils, the foils being constructed and arranged to trap the debris particles, wherein the induction heater is constructed and arranged to heat the foils.

13. A radiation source configured to generate extreme ultraviolet radiation, the radiation source comprising: a plasma formation site located at a position in which a fuel will be contacted by a beam of radiation to form a plasma; an outlet configured to allow gas to exit the radiation source and to act as a beam dump for the beam of radiation; and a contamination trap provided on a wall of the source, the contamination trap being configured to reduce an amount of debris particles that scatter or splash from the wall of the source onto a collector of the source.

14. The radiation source according to claim 13, wherein the contamination trap is provided outside an outer boundary of an EUV radiation cone formed by the collector.

15. The radiation source according to claim 13, wherein the contamination trap comprises a foil trap formed from a plurality of foils, the foils being constructed and arranged to trap debris particles arising from the generation of plasma at the plasma formation site.

16. The radiation source according to claim 15, wherein at least part of each foil has a line of sight to the plasma formation site.

17. The radiation source according to claim 16, wherein each foil subtends an angle of less than 45 degrees with respect to a trajectory which extends radially from the plasma formation site.

18. The radiation source according to claim 15, wherein at least part of each foil points towards the plasma formation site, or towards a location which is in the vicinity of the plasma formation site.

19. The radiation source according to claim 15, wherein the foils have compound shapes.

20. The radiation source according to claim 13, wherein the contamination trap comprises a plurality of tapering blocks, the tapering blocks being constructed and arranged to trap debris particles arising from the generation of plasma at the plasma formation site.

21. The radiation source according to claim 13, further comprising a heater constructed and arranged to heat the contamination trap to a temperature sufficient to melt debris that is trapped by the contamination trap, or to a temperature sufficient to evaporate debris that is trapped by the contamination trap.

22. The radiation source according to claim 21, where in the heater is an induction heater.

23. The radiation source according to claim 22, wherein the contamination trap comprises a foil trap formed from a plurality of foils, the foils being constructed and arranged to trap debris particles arising from the generation of plasma at the plasma formation site, wherein the induction heater is constructed and arranged to heat the foils.

24. A lithographic apparatus comprising:
a radiation source configured to generate extreme ultraviolet radiation, the radiation source comprising
a plasma formation site located at a position in which a fuel will be contacted by a beam of radiation to form a plasma,
an outlet configured to allow gas to exit the radiation source and to act as a beam dump for the beam of radiation, and
a contamination trap at least partially located inside the outlet, the contamination trap being configured to trap debris particles that are generated with the formation of the plasma;
a support constructed and arranged to support a patterning device, the patterning device being configured to pattern the extreme ultraviolet radiation; and
a projection system constructed and arranged to project the patterned radiation onto a substrate.

25. A lithographic apparatus comprising:
a radiation source configured to generate extreme ultraviolet radiation, the radiation source comprising
a plasma formation site located at a position in which a fuel will be contacted by a beam of radiation to form a plasma,
an outlet configured to allow gas to exit the radiation source and to act as a beam dump for the beam of radiation, and
a contamination trap provided on a wall of the source, the contamination trap being configured to reduce an amount of debris particles that scatter or splash from the wall of the source onto a collector of the source;
a support constructed and arranged to support a patterning device, the patterning device being configured to pattern the extreme ultraviolet radiation; and
a projection system constructed and arranged to project the patterned radiation onto a substrate.

* * * * *